(12) United States Patent
Bar et al.

(10) Patent No.: US 9,147,725 B2
(45) Date of Patent: Sep. 29, 2015

(54) SEMICONDUCTOR DEVICE COMPRISING AN INTEGRATED CAPACITOR AND METHOD OF FABRICATION

(71) Applicant: STMicroelectronics S.A., Montrouge (FR)

(72) Inventors: Pierre Bar, Grenoble (FR); Sylvain Joblot, Bizonnes (FR)

(73) Assignee: STMicroelectronics SA, Montrouge (FR)

( * ) Notice: Subject to any disclaimer, the term of this patent is extended or adjusted under 35 U.S.C. 154(b) by 72 days.

(21) Appl. No.: 13/935,813

(22) Filed: Jul. 5, 2013

(65) Prior Publication Data

US 2014/0015102 A1 Jan. 16, 2014

(30) Foreign Application Priority Data

Jul. 16, 2012 (FR) ...................................... 12 56838

(51) Int. Cl.
*H01L 49/02* (2006.01)
*H01L 27/02* (2006.01)
*H01L 27/08* (2006.01)

(52) U.S. Cl.
CPC ............ *H01L 28/92* (2013.01); *H01L 27/0207* (2013.01); *H01L 27/0805* (2013.01); *H01L 28/91* (2013.01)

(58) Field of Classification Search
CPC ................................ H01L 28/92; H01L 21/02
USPC ........................................... 257/534; 438/306
See application file for complete search history.

(56) References Cited

U.S. PATENT DOCUMENTS

2012/0080772 A1 4/2012 Asami et al.
2012/0146182 A1 6/2012 Oganesian et al.

FOREIGN PATENT DOCUMENTS

WO WO-2009104132 A1 8/2009

OTHER PUBLICATIONS

INPI Preliminary Search Report and Written Opinion for FR 1256838 mailed Mar. 19, 2013 (8 pages).

*Primary Examiner* — Matthew Gordon
(74) *Attorney, Agent, or Firm* — Gardere Wynne Sewell LLP

(57) ABSTRACT

A semiconductor device includes a substrate wafer and having a front face and a back face. A front hole is formed in the front face and a multilayer capacitor is formed in the front hole. A back hole is formed in the back face of the substrate wafer to expose at least a portion of the multilayer capacitor. A front electrical connection on the front face and a back electrical connection in the back hole are used to make electrical connection to first and second conductive plates of the multilayer capacitor which are separated by a dielectric layer. The front hole may have a cylindrical shape or an annular shape.

10 Claims, 13 Drawing Sheets

SEMICONDUCTOR DEVICE COMPRISING AN INTEGRATED CAPACITOR AND METHOD OF FABRICATION

PRIORITY CLAIM

This application claims priority from French Application for Patent No. 1256838 filed Jul. 16, 2012, the disclosure of which is incorporated by reference.

TECHNICAL FIELD

The present invention relates to the field of semiconductor devices.

BACKGROUND

A known solution for fabricating capacitors, as disclosed by United States Patent Application Publication 2008/0173993 (the disclosure of which is incorporated by reference), comprises forming a capacitor on the front face of a substrate comprising integrated circuits, in a blind hole of the substrate, whose electrodes extend into the substrate and have, on top of the front face of the substrate, portions running radially to the blind hole and connected to the integrated circuits.

There exists a need to produce capacitors allowing the distances of the electrical connections and the electrical resistances to be reduced, and/or the integration densities to be increased and/or the developed surface areas of the capacitors to be increased and/or the leakage current losses and the polarizations to be reduced.

SUMMARY

According to one aspect, a semiconductor device is provided comprising: a wafer comprising a substrate wafer and having a front face and a back hole open towards the back and formed, at least in part, in the substrate wafer and having a bottom, and a plurality of capacitors in the form of columns which run towards the back protruding into the back hole with respect to the bottom of this back hole and which are separated from one another. Each capacitor comprises: an electrically conducting inner layer or part forming an inner electrode and having a front electrical connection surface, a outer electrically conducting layer forming an outer electrode and having, in the back hole, a back electrical connection surface, and an intermediate dielectric layer between the inner layer and the outer layer, forming a separation layer between the electrodes.

According to one embodiment, the device comprises a front dielectric layer on the front face of the substrate wafer, including a front interconnection network connected to the front electrical connection surfaces for the inner electrodes of the columns.

According to one embodiment, the device comprises an electrically conducting back layer connected to back electrical connection surfaces of the outer electrodes of the columns.

According to one embodiment, the device comprises a dielectric passivation layer between the substrate wafer and the conducting back layer.

According to one embodiment, the columns comprise a plurality of cylindrical columns spaced out from one another and an annular column surrounding, at a distance, the plurality of cylindrical columns, the back hole having a side wall coming into contact with a back part of the annular column.

According to one embodiment, the device comprises a dielectric passivation layer between the substrate wafer and the outer electrode of the annular column.

According to one embodiment, the front face of the substrate wafer comprises, on its front face, integrated semiconductor components connected to a front interconnection network.

According to another aspect, a method is provided for fabricating a semiconductor device on a wafer having a front face and a back face, comprising the following steps: forming a plurality of main blind holes on the front face of the wafer, forming in the main blind holes of the columns respectively and successively comprising an outer layer of an electrically conducting material covering the side walls and the bottoms of the main holes, a separation layer of a dielectric material covering the outer conducting layer and an inner layer or part made of an electrically conducting material covering or filling the separation layer, in such a manner that the outer conducting layer and the conducting central part of each column, separated by the separation layer, form a capacitor; and forming a back secondary blind hole on the back face of the wafer, such that the columns have back parts protruding into this secondary hole and such that the outer conducting layer of each column is at least partly uncovered.

According to one embodiment, the method comprises the following steps: forming front electrical connection means connected to the front faces of the inner layers or parts of the columns and forming back connection means connected, in the secondary hole, to the conducting outer layers of the columns.

The front electrical connection means can comprise a front electrical connection network.

The back connection means can comprise a back layer of an electrically conducting material, extending over the protruding back parts of the columns and running over a back face of the wafer.

According to one embodiment, the method comprises the following steps: forming columns respectively comprising an intermediate passivation layer of a dielectric material between the side wall and the bottom of the main holes and the outer conducting layer; and removing at least a part of this passivation layer in the secondary hole so as to open up at least a part of the conducting outer layers of the columns.

An intermediate passivation layer may also be formed covering the wall of the secondary hole, except for the parts of the uncovered outer conducting layers of the columns, and covering at least a part of the back face of the wafer.

The columns can comprise a plurality of cylindrical columns spaced out from one another and an annular column surrounding, at a distance, the plurality of cylindrical columns, the secondary hole having a side wall coming into contact with a back part of the annular column.

An intermediate passivation layer between the annular column and the wafer and an intermediate passivation layer on the wall of the back secondary hole and the back face of the wafer may also be formed, these passivation layers meeting behind the outer conducting layer of the annular column.

BRIEF DESCRIPTION OF THE DRAWINGS

Examples of semiconductor devices and their methods of fabrication will now be described by way of non-limiting examples and illustrated by the drawings, in which.

DETAILED DESCRIPTION OF THE DRAWINGS

Figure 1:
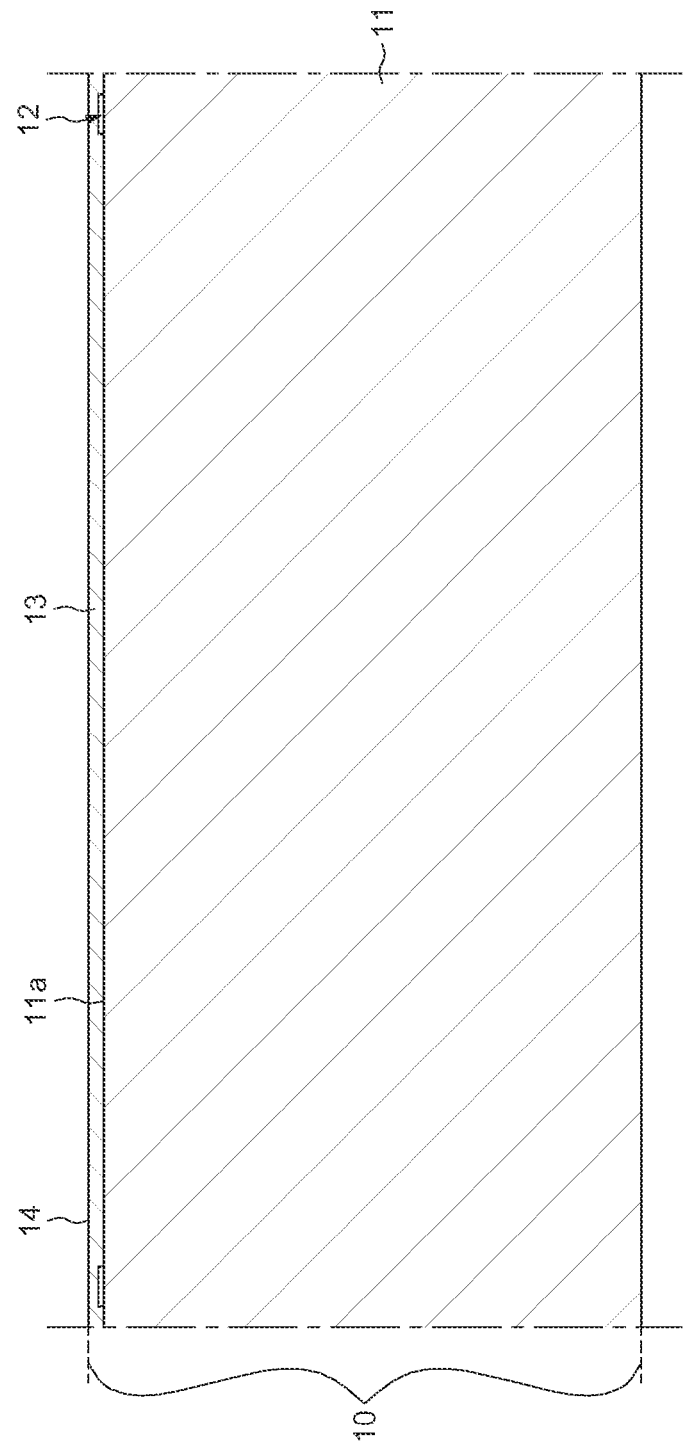
FIGS. 1 to 2 and 4 to 12 show cross sections of successive states leading to the fabrication of one embodiment of a semiconductor device.

FIG. 1 illustrates a wafer 10 comprising a substrate 11 in the form of wafer, for example made of silicon, on a front face 11a of which integrated circuits 12 have previously been fabricated, which do not occupy the whole of this face, and a layer 13 of a dielectric material is deposited, for example of silicon oxide ($SiO_2$) or of silicon nitride (SiN), the outer face of the layer 13 forming a front face 14 of the wafer 10.

Figure 2:
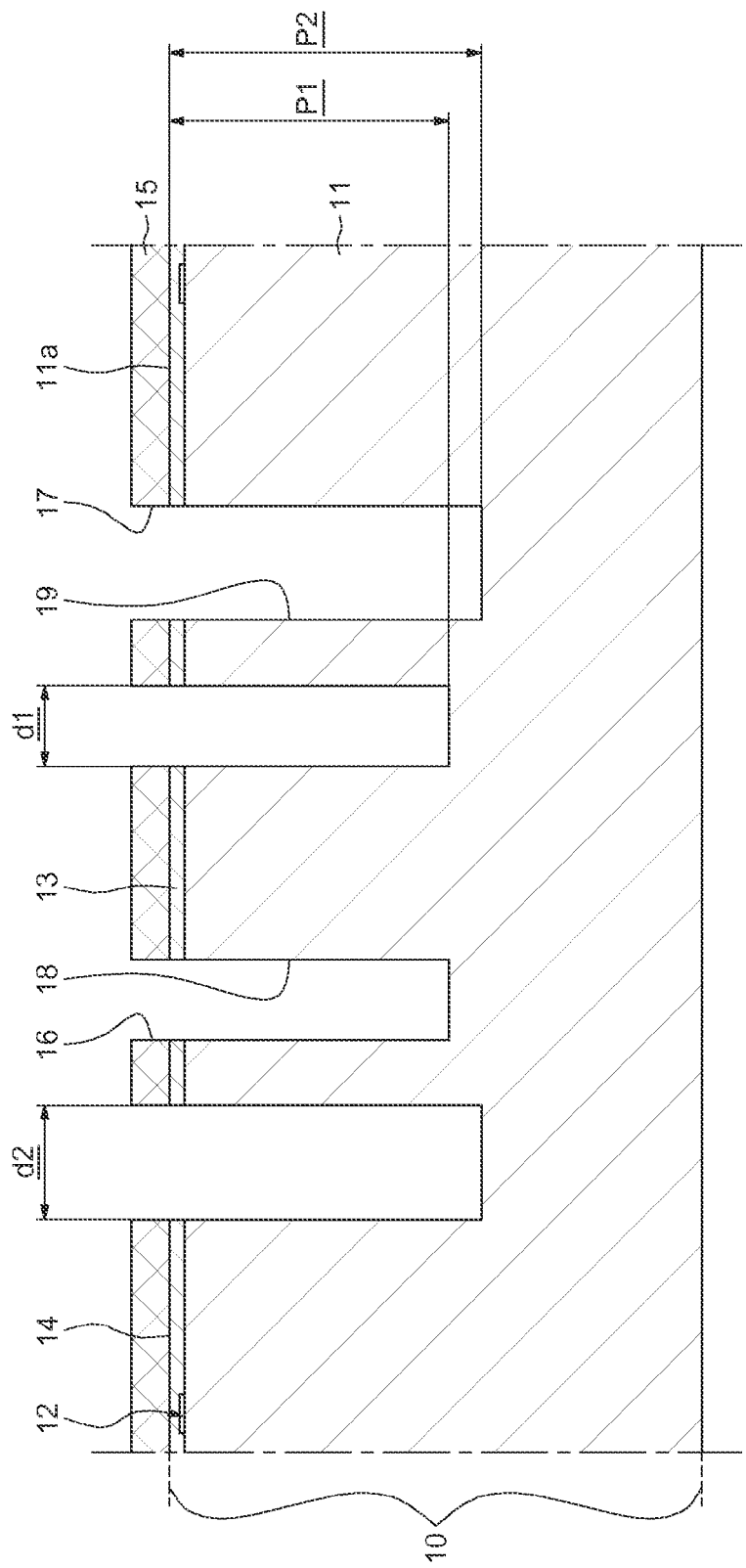
Figure 3:
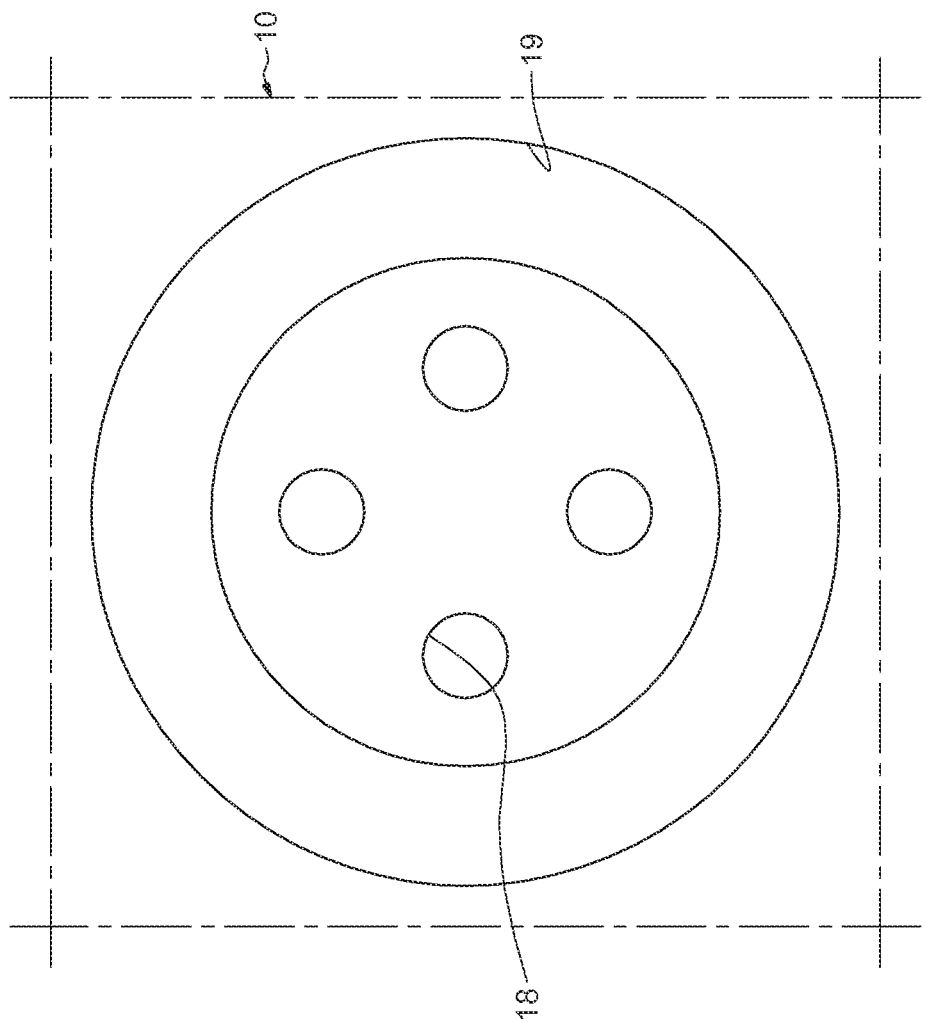
FIG. 3 shows a top view of FIG. 2.

As illustrated in FIGS. 2 and 3, a mask layer 15 is deposited on the front face 14 and, in this layer 15 in an area with no integrated circuits 12, through-openings are formed, of which there are a plurality of openings, for example cylindrical 16, spaced out, and one opening, for example annular 17, surrounding, at a distance, the plurality of cylindrical openings 16, such that the diameter d1 of the cylindrical openings 16 is smaller than the width d2 of the annular opening 17, in other words the distance between the outer diameter and the inner diameter of this annular opening 17.

Subsequently, an etch of the layer 13 and of the substrate 11 is carried out, in such a manner as to produce main blind holes, of which there are blind cylindrical holes 18 with a diameter d1 and one blind annular groove 19 with a width d2, after which, the layer 15 is removed.

The result of the simultaneous etching hereinabove is that, as the diameter d1 of the blind cylindrical holes 18 is smaller than the width d2 of the blind annular groove 19, the depth P1 of the blind cylindrical holes 18 is smaller than the depth P2 of the blind annular hole 19.

Figure 4:
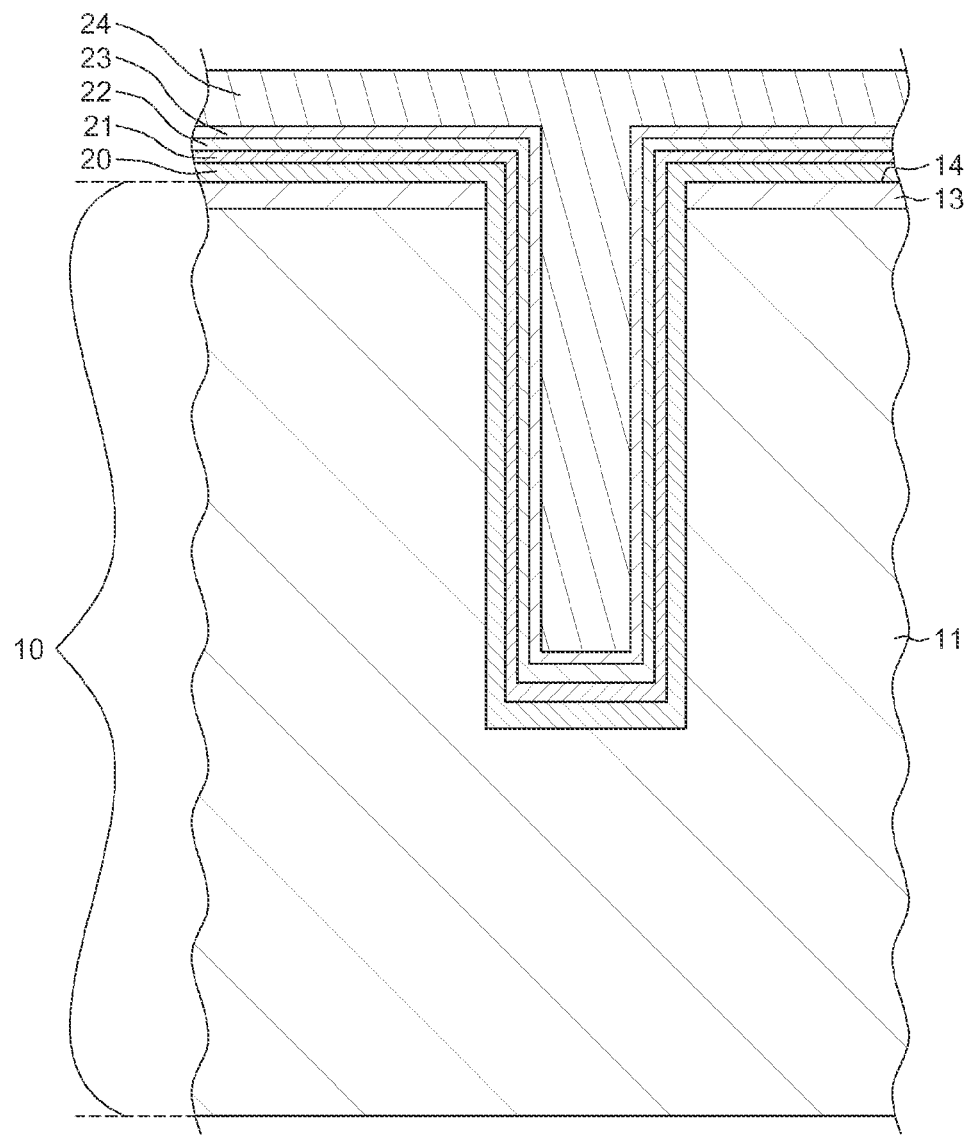

As illustrated in FIG. 4, successive depositions of a plurality of layers are carried out onto the face 14 of the wafer 10 and onto the sides and bottoms of the blind holes 18 and 19, which comprise, for example:
- a dielectric passivation layer 20 (for example of silicon oxide ($SiO_2$) or silicon nitride ($SiO_xN_y$),
- then a layer 21 of an electrically conducting material (for example titanium nitride (TiN), tantalum nitride (TaN), titanium (Ti), tantalum (Ta)),
- then a layer 22 of a dielectric material (for example $Ta_2O_5$, SiN, SiO2, $Al_2O_3$, $ZrO_2$)
- then a layer 23 of an electrically conducting material (for example titanium nitride (TiN), tantalum nitride (TaN), titanium (Ti), tantalum (Ta)),
- and finally, a filling layer 24 of an electrically conducting material (for example copper (Cu), tungsten (W)).

Subsequently, the removal of portions of the layers 20, 21, 22, 23 and 24 situated on top of the front face 14 of the wafer 10 is undertaken, for example by chemical-mechanical polishing.

Figure 5:
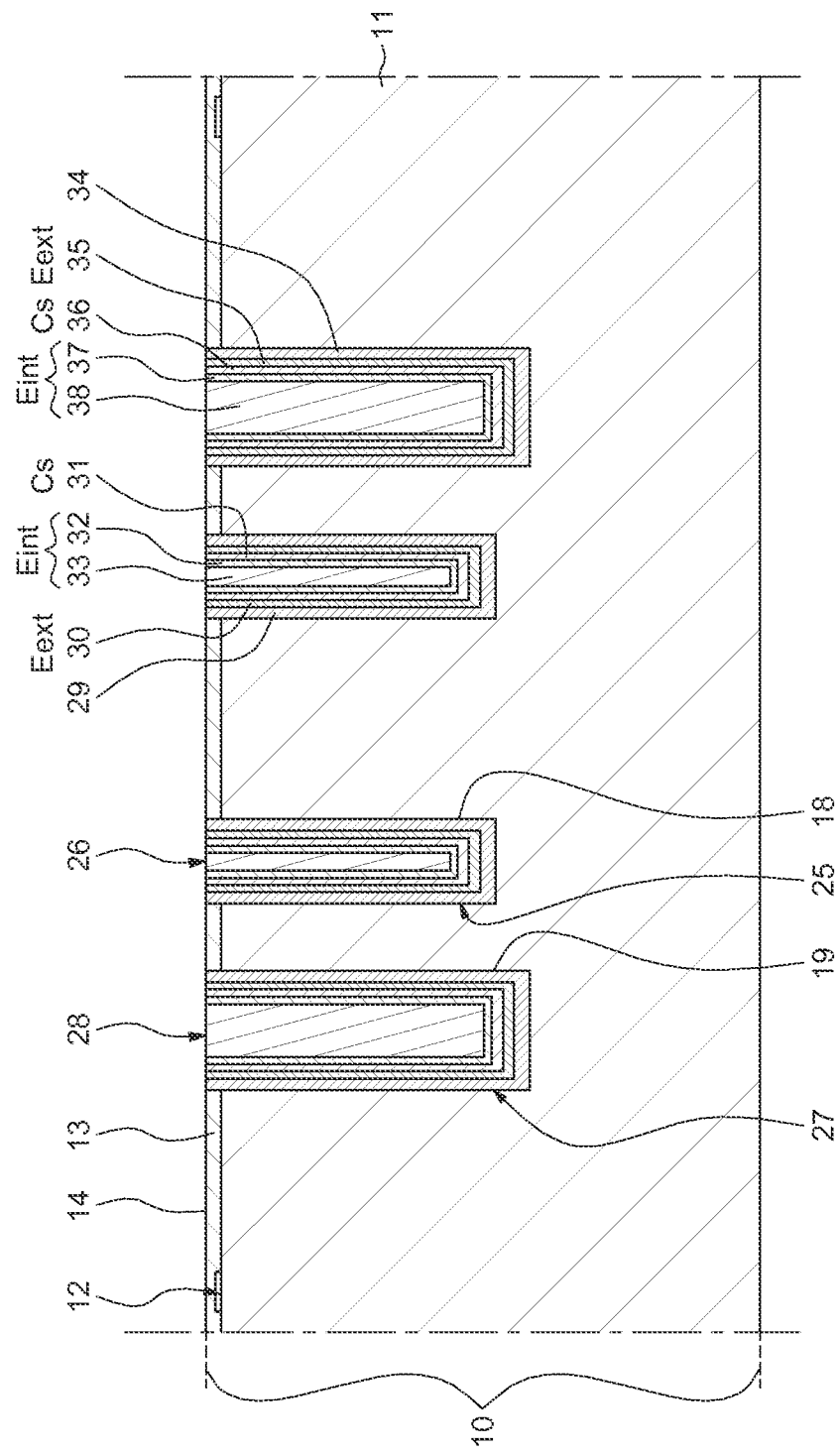

Intermediate cylindrical columns 25 situated in the blind cylindrical holes 18, which present faces 26 in the plane of the face 14, and an intermediate annular column 27 situated in the annular hole 19, which also presents a front face 28 in the plane of the face 14, are then obtained, as illustrated in FIG. 5.

Each intermediate cylindrical column 25 and the annular column 27 comprise, on the sides and on the bottoms of the holes 18 and 19 respectively, superposed layers 29, 30, 31, 32 and 33, and superposed layers 34, 35, 36, 37 and 38, respectively, corresponding to remaining portions of the layers 20, 21, 22, 23 and 24. Each of the superposed layers 29, 30, 31 and 32, on the one hand, and each of the superposed layers 34, 35, 36 and 37, on the other, have a cross section in the form of a U and are included within one another. On the one hand, the inner layer or part 33 fills the internal space of the layer 32 and, on the other hand, the inner layer or part 38 fills the internal space of the layer 37. The front end faces of the superposed layers 29, 30, 31, 32 and 33 form the front face 26 and the front end faces of the superposed layers 34, 35, 36, 37 and 38 form the front face 28.

Thus, each intermediate cylindrical column 25 forms a capacitor C1 whose outer conducting layer 30 forms an outer electrode Eext, whose central conducting layers 32 and 33 form an inner electrode Eint and whose intermediate dielectric layer 31 forms a dielectric separation layer Cs between these electrodes Eext and Eint.

In a corresponding manner, the intermediate annular column 27 forms a capacitor C2 whose outer conducting layer 35 forms an outer electrode Eext, whose central conducting layers 37 and 38 form an inner electrode Eint and whose intermediate dielectric layer 36 forms a separation layer Cs between these electrodes Eext and Eint.

Figure 6:
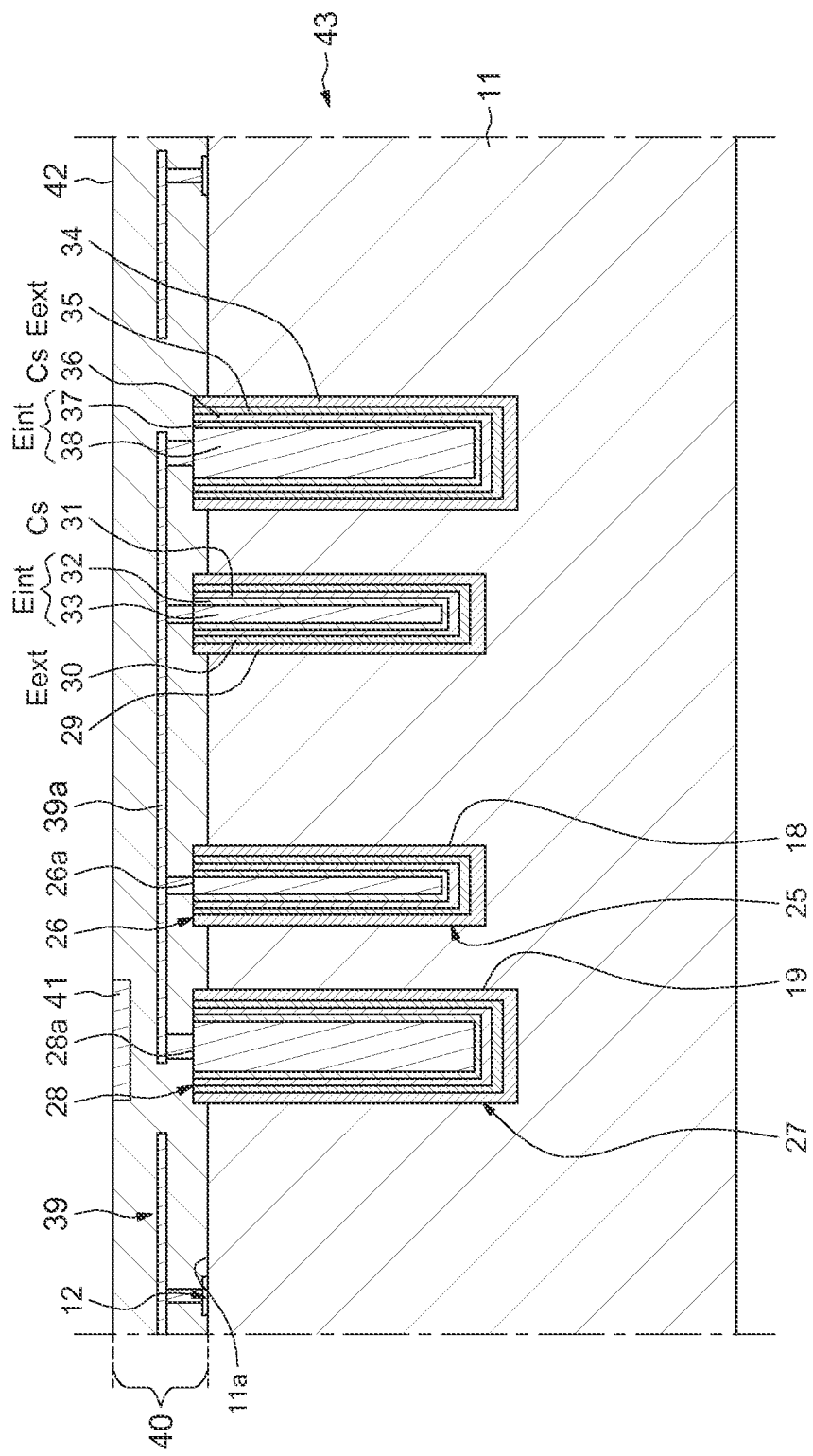

As illustrated in FIG. 6, a front electrical connection network 39 is subsequently formed, over several metal levels integrated into a front dielectric multilayer 40 formed over the front face 11a of the substrate 11 and including the first dielectric layer 13.

The front electrical connection network 39 is intended for forming the electrical connections of the integrated circuits 12 either between them and/or with the outside, by means of front connecting lugs 41 arranged on or in the outer front face 42 of the front layer 40.

The front electrical connection network 39 is furthermore connected to the front end surfaces 26a and 28a of the inner electrodes Eint of the capacitors C1 and C2, situated on the respective front faces 26 and 28 of the columns 25 and 26. According to one exemplary embodiment, the inner electrodes Eint of the capacitors C1 and C2 can be connected in parallel on a branch 39a of the front electrical connection network 39, by means of vias in contact with the central parts of the front faces 26 and 28. According to another exemplary embodiment, the inner electrodes Eint of the capacitors C1 and C2 could be selectively connected in a different manner.

An intermediate semiconductor device 43 is then obtained.

Figure 7:
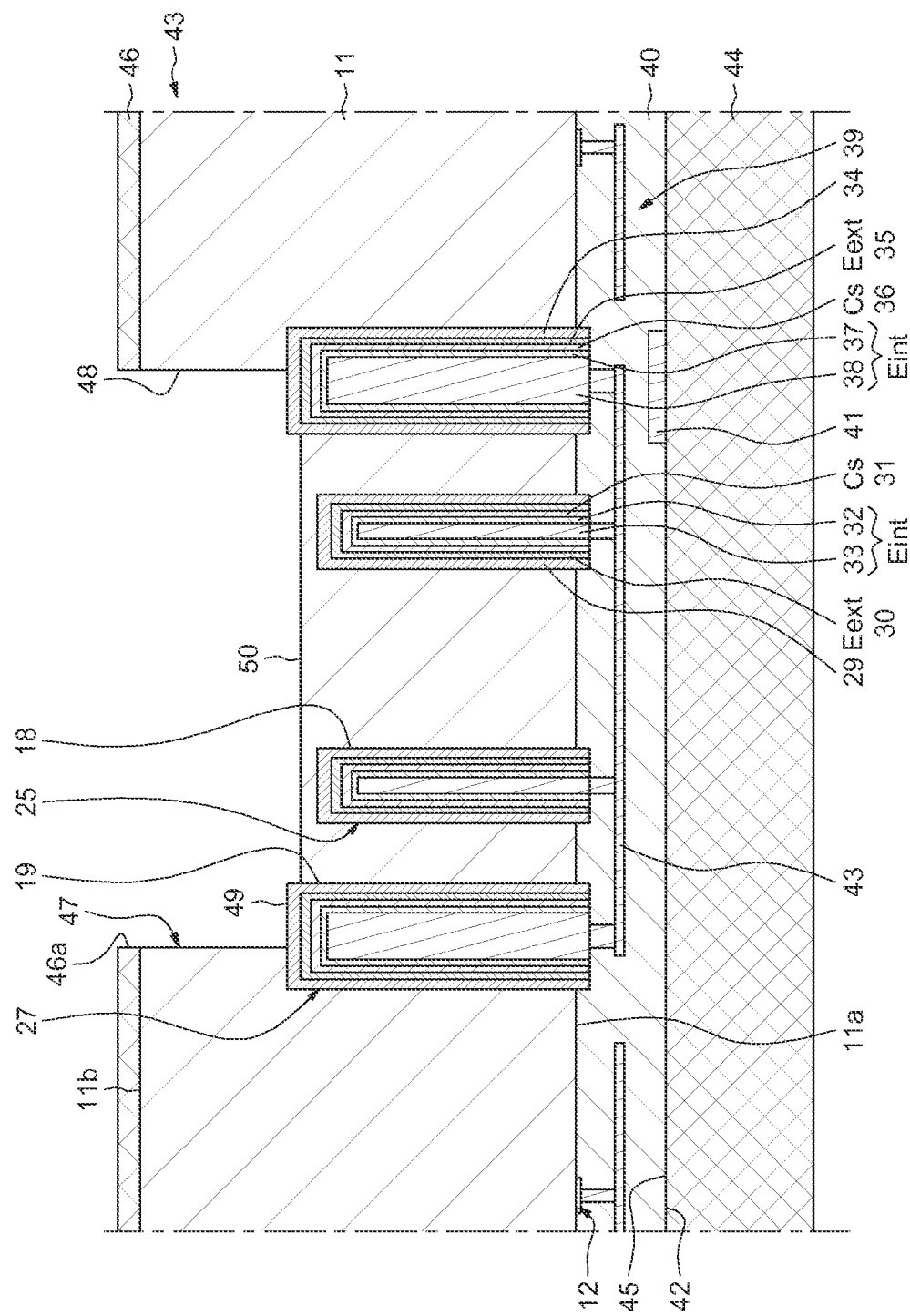

As illustrated in FIG. 7, the intermediate semiconductor device 43 is fixed onto a temporary carrier 44 in a position such that the outer face 42 of the intermediate semiconductor device 43 is abutted onto a top surface 45 of this temporary carrier 44.

As illustrated in this FIG. 7, after having potentially carried out a thinning of the thickness of the substrate 11, etching of the substrate 11 is carried out through a mask 46 formed on its back face 11b and having a cylindrical through-opening 46a, via its back face 11b opposite to its front face 11a, so as to form an back intermediate cylindrical hole 47.

The cylindrical through-opening 46a is placed in such a manner that the back intermediate cylindrical hole 47 is centered on the axis of the intermediate annular column 27 and has a cylindrical side wall 48 situated on top of the intermediate annular column 27, the diameter of the intermediate cylindrical hole 47 being included between the inner diameter and the outer diameter of the intermediate annular column 27.

The intermediate cylindrical hole 47 is formed down to a depth such that a back inner annular portion 49 of the outer passivation layer 34 of the intermediate annular column 27 is opened up, by eliminating an inner annular part of the bottom of the annular hole 19, and such that the bottom 50 of this intermediate cylindrical hole 47 is situated further back than the bottom of the cylindrical holes 18 so as not to uncover the back ends of the intermediate cylindrical columns 25.

Figure 8:
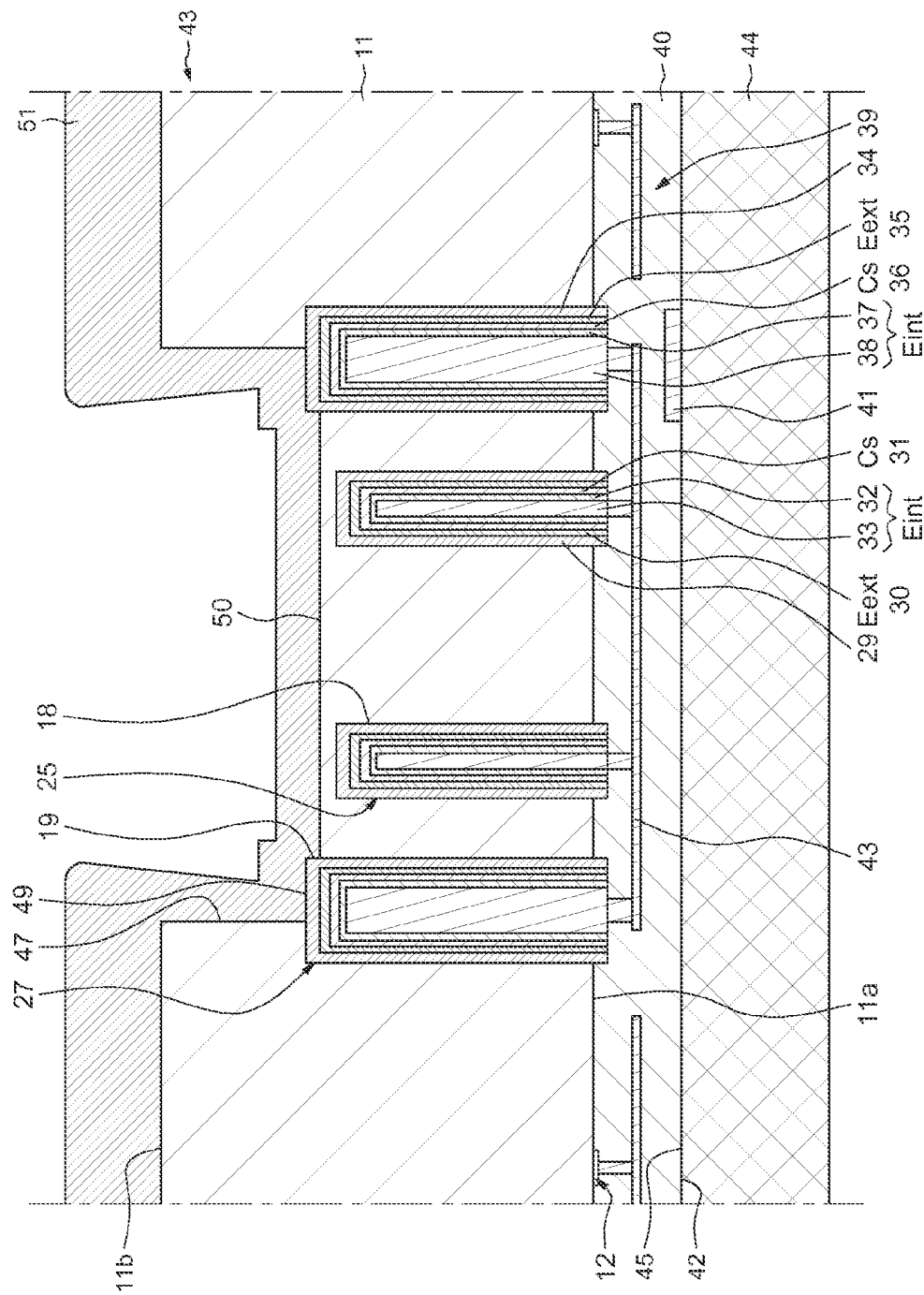

As illustrated in FIG. 8, after having removed the mask 46, a back dielectric passivation layer 51 (for example of silicon oxide ($SiO_2$)) is subsequently deposited, which covers the back face 46 of the substrate 11, the cylindrical side wall 48 of the cylindrical hole 47 of the substrate 11, the uncovered back annular part 49 of the intermediate annular column 27 and the bottom 50 of the cylindrical hole 47 of the substrate 11 situated inside of the uncovered back annular part 49. This deposition is carried out for example by a chemical vapor deposition (commonly called CVD deposition). The conformation of such a deposition is not perfect such that the thickness of the layer 51 on the back face 46 is greater than the thickness of this layer 51 on the bottom 50 and the uncovered annular parts 49.

Figure 9:
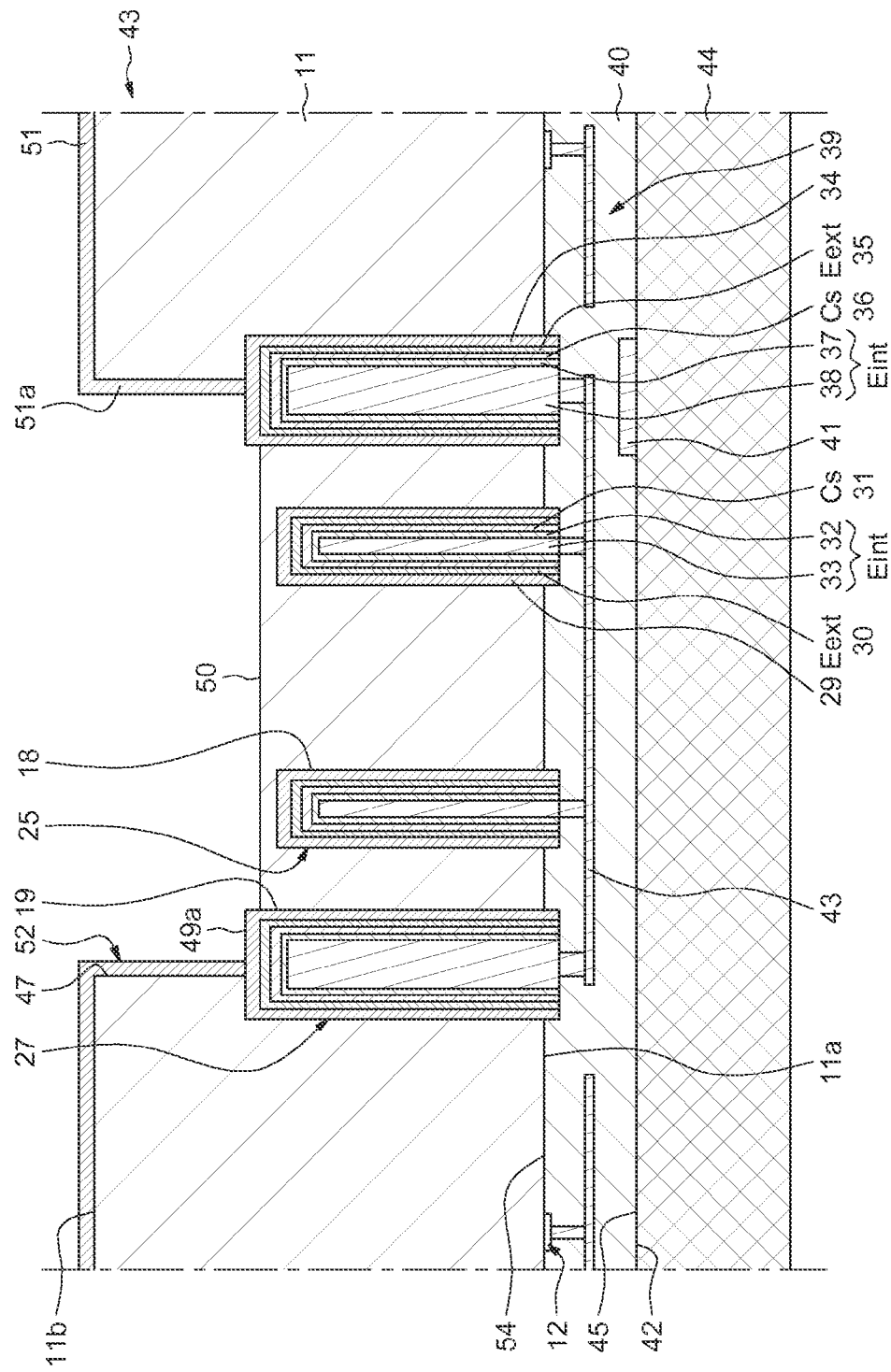

As illustrated in FIG. 9, a selective directional etch of the passivation layer 51 is subsequently carried out, for example by anisotropic ion etching, in such a manner as to remove the part of this layer 51 covering the bottom 50 of the hole 47 and an inner annular part 49a of the back annular part 49 of the intermediate annular column 27, without uncovering the back face 46 of the substrate and without uncovering the side wall 48 of the cylindrical hole 47.

An intermediate back hole 52 whose bottom is formed by the bottom 50 of the intermediate hole 47 and the uncovered inner annular part 49a and whose side wall 51a is formed by the part of the layer 51 left against the side wall 48 of the intermediate back hole 47, this side wall 51a being in contact with the outer layer 34 of the intermediate annular column 27.

Figure 10:
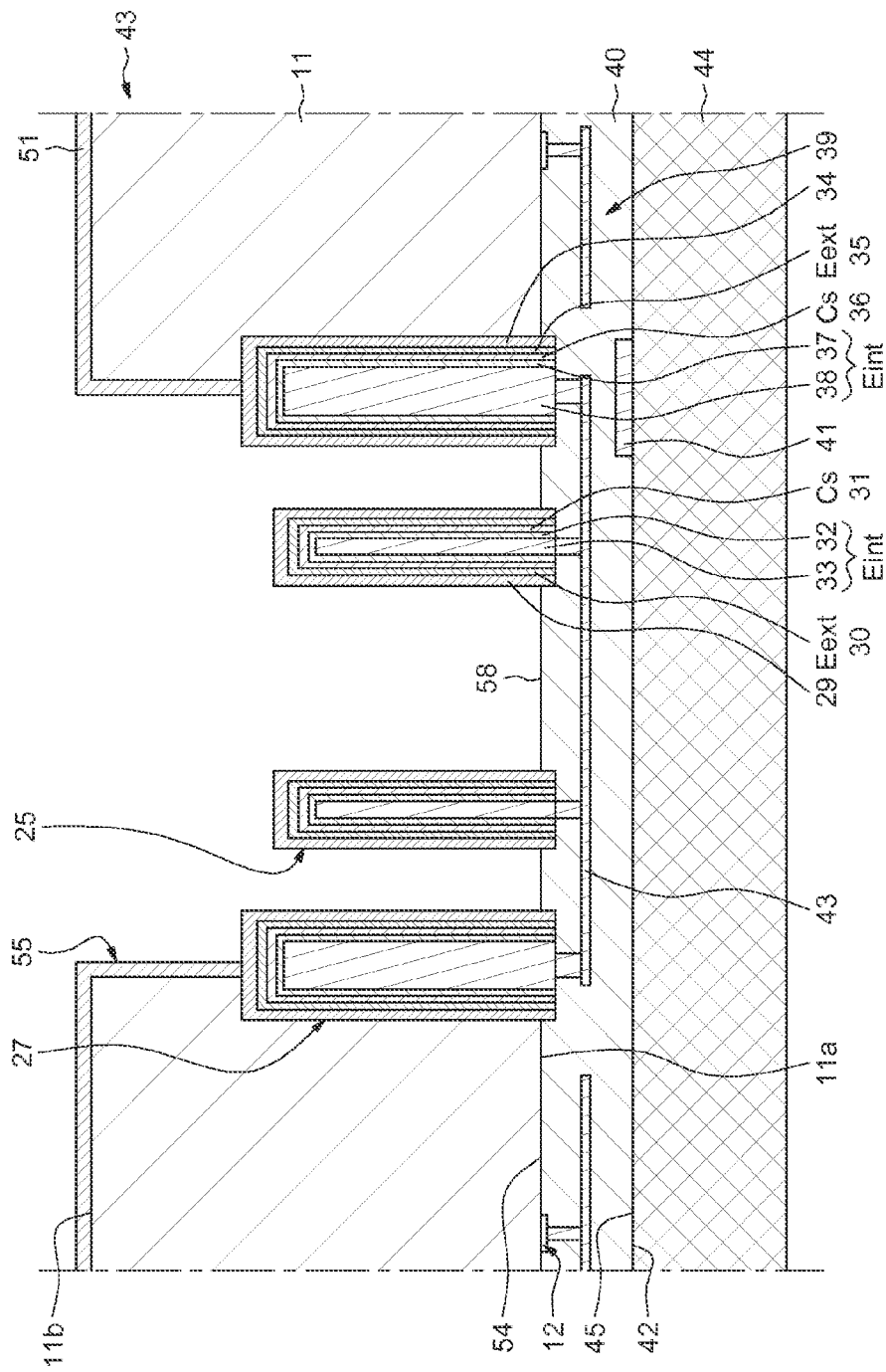

As illustrated in FIG. 10, a selective etch through the hole 52 is subsequently carried out down to a bottom 53 situated for example on the back face 54 of the front dielectric layer 40 situated on the front face 11a of the substrate 11, in such a manner as to remove the material of the substrate 11 located inside of the intermediate annular column 27 and around the intermediate cylindrical columns 26 down to this bottom 53, without removing either the insulating layer 51 coating the surface 11b and the sides of the hole 52 or the portion of the layer 34 of the intermediate annular column 27. The front dielectric layer 40 then enables the etch to be stopped. According to one variant embodiment, this etch could be stopped before it reaches the front layer 40.

A back secondary hole 55 is then obtained in which the intermediate cylindrical columns 25 are protruding towards the back with respect to the bottom 53 of this back secondary hole 55 and in which the intermediate annular column 27 forms a part of the side wall of the back secondary hole 55 adjacent to the bottom 53 of this back secondary hole 55, the remainder of the side wall of the back secondary hole 55 and the back face 46 staying covered by the remaining part of the layer 51 as previously described.

Figure 11:
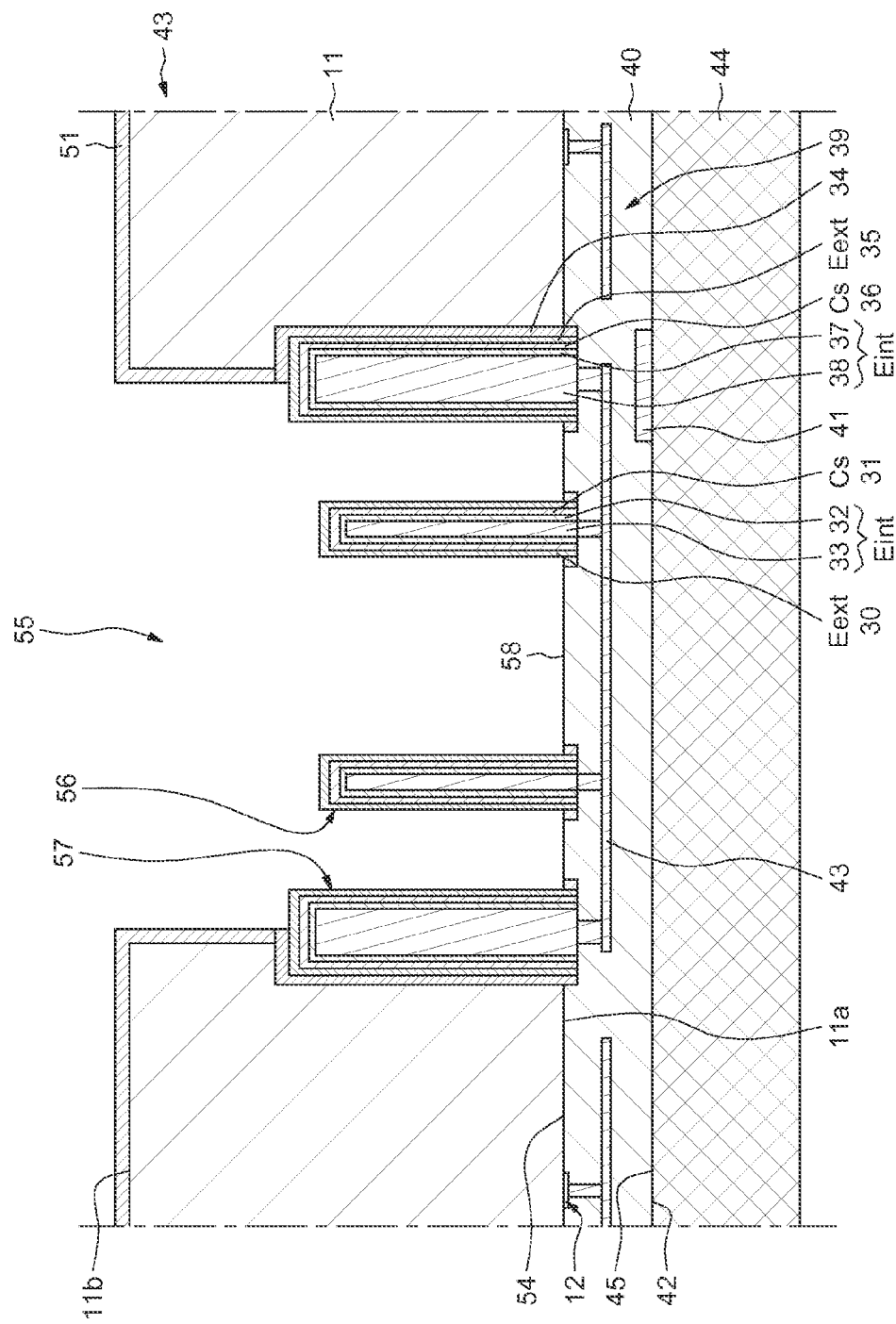

As illustrated in FIG. 11, a selective etch is subsequently carried out in the back secondary hole 55 and down to the bottom 53 of this hole 55, for example by an isotropic chemical etch, so as to remove, in the hole 55, the portions of the outer layers 29 of the intermediate cylindrical columns 26 and the portion of the layer 34 of the intermediate annular column 27 partially forming the wall of the back secondary hole 55. Although it is slightly etched, the layer 51 remains present.

When this has been done, final cylindrical columns 56 are obtained which are protruding towards the back with respect to the bottom 53 of the back secondary hole 55 and whose outer conducting layers 30 forming the outer electrodes Eext of the capacitors C1 are opened up in the back secondary hole 55.

A final annular column 57 whose outer conducting layer 35 forming the outer electrode Eext of the capacitor C2 is opened up in the back secondary hole 55 is also obtained. The uncovered portion of the conducting layer 35 forms a part of the side wall of the back secondary hole 55 adjacent to the bottom 53 of this back secondary hole 55. The remainder of the side wall of the back secondary hole 55 and the back face 46 stay covered by the remaining part of the layer 51.

The remainder of the dielectric layer 34 and the remainder of the dielectric layer 51 both continue separately or meet just behind the back face of the outer conducting layer 35.

Figure 12:
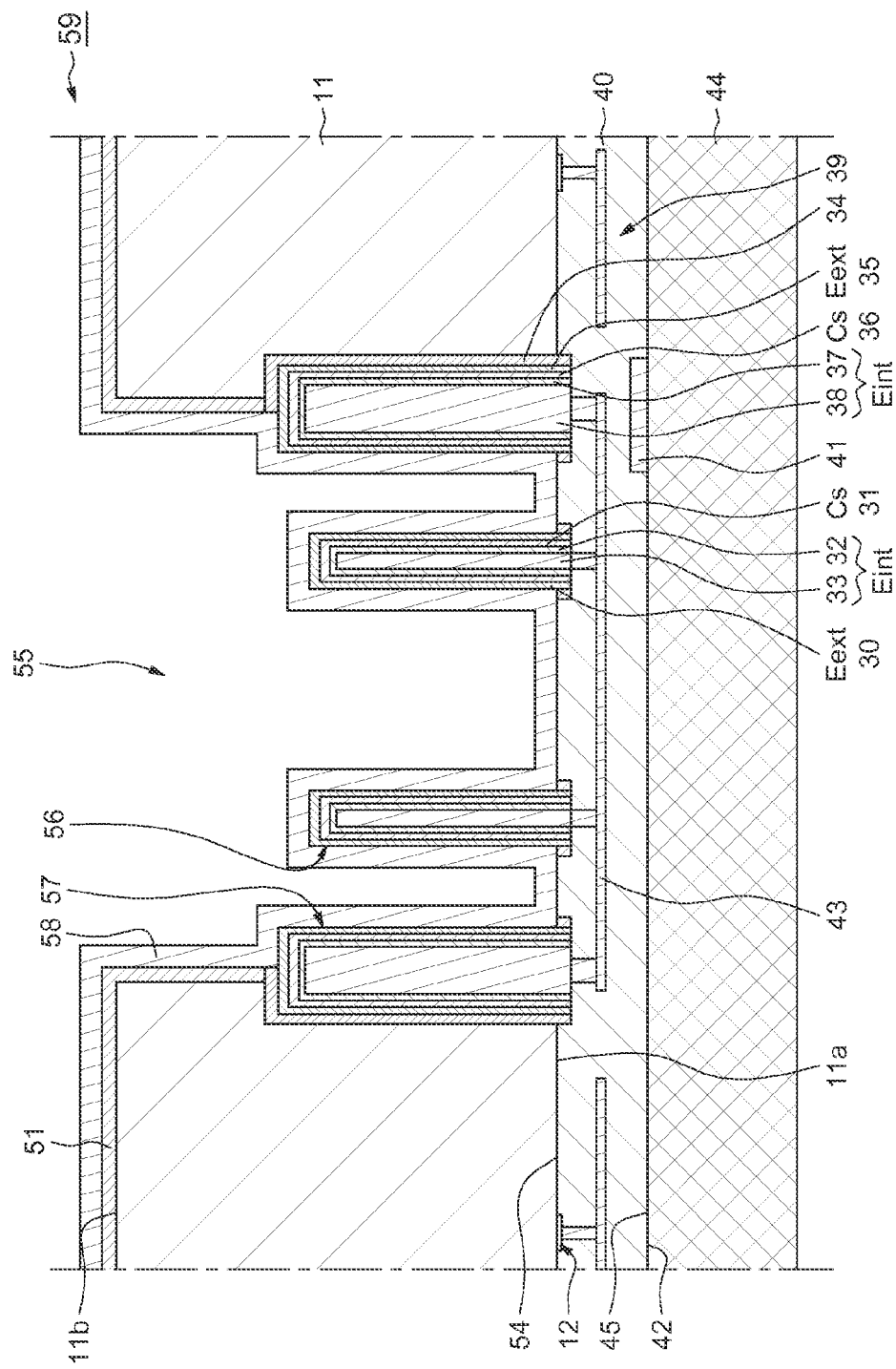

As illustrated in FIG. 12, the deposition of a back layer 58 of an electrically conducting material (for example copper (Cu)) is subsequently carried out. This conducting layer 59 wraps around the cylindrical columns 56 covering the outer conducting layers 30 forming the outer electrodes Eext of the capacitors C1, covers the bottom 54 of the back secondary hole 55, runs over the side wall of the back secondary hole 55 covering the uncovered portion of the outer conducting layer 35 forming the outer electrode Eext of the capacitor C2 and covering the remaining part of the dielectric layer 51 in the hole 55 and runs over the dielectric layer 51 on top of the back face 11a of the substrate 11.

Thus, the back conducting layer 58 is in contact with the outer surface of the outer conducting layers 30 and 35 over almost the entire height of the cylindrical columns 25 and of the intermediate annular column 27. It thus forms a back means of electrical connection, of low resistance, for the outer electrodes Eext formed by the outer conducting layers 30 and 35 of the capacitors C1 and C2.

Figure 13:
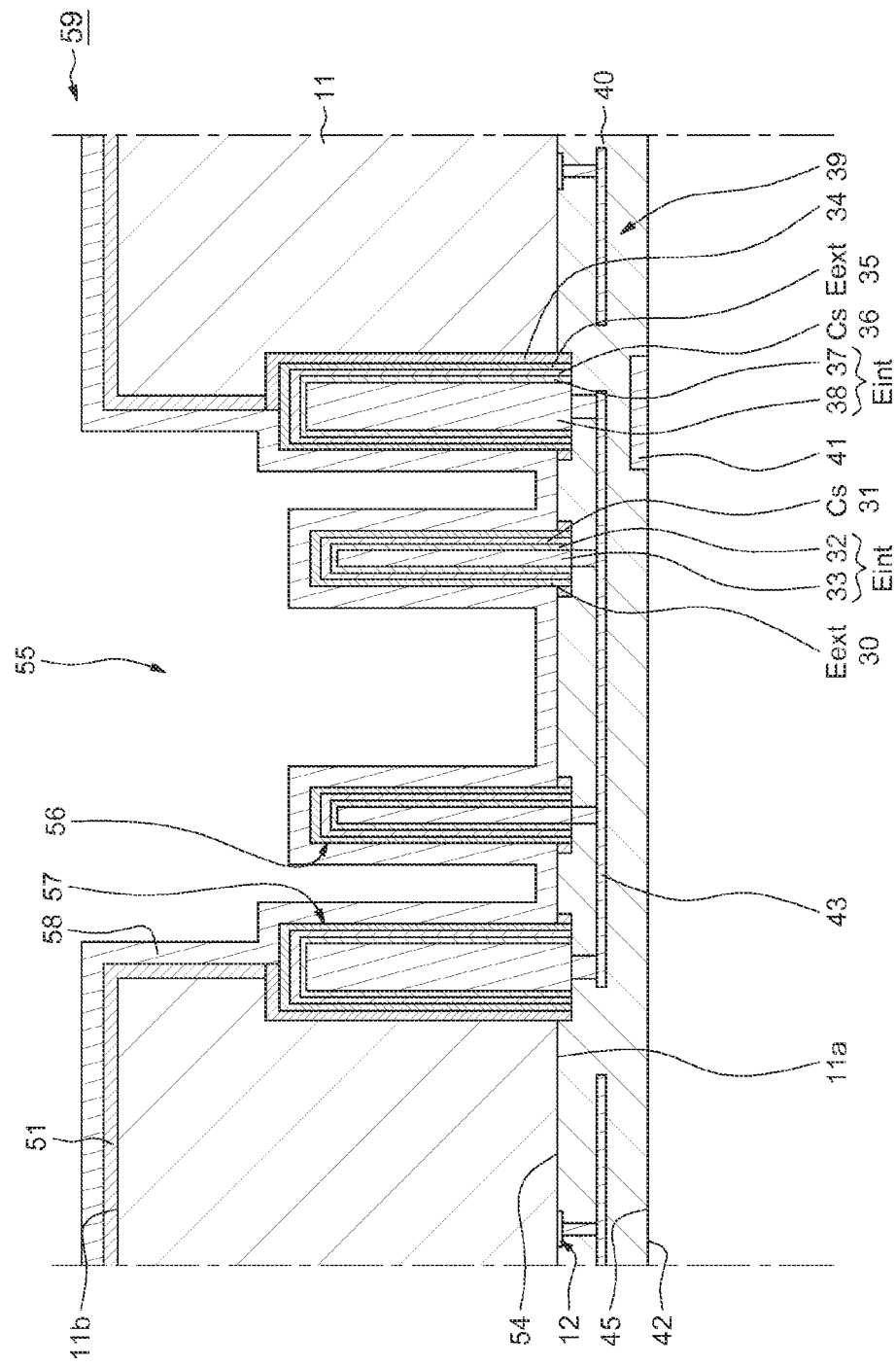
FIG. 13 shows the semiconductor device.

After having removed the support 44, as illustrated in FIG. 13, a semiconductor device 59 is thus obtained comprising a plurality of capacitors C1 protruding into the back secondary hole 55 and a capacitor C2 partially and laterally protruding into the back secondary hole 55, installed through the substrate 11, and in which the inner electrodes Eint of the capacitors C1 and C2 are connected to the front electrical connection network 39 and whose outer electrodes Eext are connected to the back electrical connection layer 58.

Various configurations for electrical connection of capacitors C1 and C2 are possible, in particular the following.

The front electrical connection network 39 can be arranged for connecting the inner electrodes Eint to the integrated circuits 12 and/or to front lugs for external electrical connection with a view to being connected to another semiconductor device.

The part of the conducting back layer 58 situated on top of the back face 46 of the substrate 11 can be arranged in the form of one or more electrical connection tracks. These tracks may be connected to one or more electrical connection vias (not shown) passing through the substrate 11 with a view to being connected to the front electrical connection network 39 and/or to one or more back lugs for external electrical connection with a view to being connected to another electronic device. These vias may be connected, by means of the front electrical connection network 39, to the integrated circuits 12 and/or to front lugs for external electrical connection with a view to being connected to another electronic device.

According to one variant, the inner electrodes Eint and the outer electrodes Eext of the capacitors C1 and C2 can be connected in parallel so as to form a single capacitor. According to another variant, the front electrical connection network 39 and the back electrical connection layer 58 can be arranged so as to assemble electrically independently or by groups the electrodes of the capacitors C1 and C2 in order to form independent capacitors.

The various steps having led to the fabrication of the semiconductor device 59 may be implemented with a view to a collective fabrication of a plurality of semiconductor devices 59 on a common substrate wafer 11, followed by a dicing up of the semiconductor devices 59 fabricated.

The structures and configurations and the modes of fabrication of the semiconductor devices which have just been described allow high integration densities of the capacitors to be reached, and capacitors with a low series resistance inside the electrodes to be obtained.

According to one variant embodiment, just one electrical device could be fabricated comprising only spaced out cylindrical columns forming capacitors protruding into a back hole.

Nevertheless, the presence of the annular column 27, combined with the aforementioned remainder of the back passivation layer 51, allows the removal of the outer passivation layers 29 from the cylindrical columns in the back hole in order to expose the outer conducting layers 30 in the back hole, with a view to the formation of a back layer 58 for electrical connection of the outer electrodes Eext formed by these outer conducting layers 30. Any polarization and current leaks into the substrate 11 made of silicon, and also the contamination of the metal species by diffusion can thus be avoided.

The present invention is not limited to the examples described hereinabove. In particular, certain fabrication steps described could be organized differently and the electrical connections could be configured according to differently combined dispositions. Many other variant embodiments are possible without straying from the scope of the invention.

What is claimed is:

1. A semiconductor device, comprising
   a wafer including a substrate wafer having a front face and a back hole open towards a back face and formed, at least in part, in the substrate wafer and having a bottom, and
   a plurality of capacitors in the form of columns which run towards the back face protruding into the back hole with respect to the bottom of the back hole and which are separated from one another,
   each capacitor comprising:
      an inner electrically conducting layer or part forming an inner electrode and having a front electrical connection surface,
      an electrically conducting outer layer forming an outer electrode and having, in the back hole, a back electrical connection surface, and
      an intermediate dielectric layer between the inner layer and the outer layer, forming a separation layer between the inner and outer electrodes.

2. The device according to claim 1, further comprising a front dielectric layer on the front face of the substrate wafer, including a front interconnection network connected to the front electrical connection surfaces for the inner electrodes of the columns.

3. The device according to claim 1, further comprising an electrically conducting back layer connected to back electrical connection surfaces of the outer electrodes of the columns.

4. The device according to claim 3, further comprising a dielectric passivation layer between the substrate wafer and the conducting back layer.

5. The device according to claim 1, wherein the columns comprise:
   a plurality of cylindrical columns spaced out from one another, and
   an annular column surrounding, at a distance, the plurality of cylindrical columns,
   the back hole having a side wall coming into contact with a back part of the annular column.

6. The device according to claim 5, further comprising a dielectric passivation layer between the substrate wafer and the outer electrode of the annular column.

7. The device according to claim 1, wherein the front face of the substrate wafer comprises, on its front face, integrated semiconductor components connected to a front interconnection network and said plurality of capacitors.

8. A semiconductor device, comprising:
   a semiconductor substrate having a first surface and an opposed second surface;
   a first opening formed in the first surface;
   a plurality of multilayer capacitors formed in said first opening, each multilayer capacitor including first and second electrodes separated by a dielectric layer, wherein the plurality of multilayer capacitors are separated from each other;
   a second opening formed in the second surface to expose the first electrode of said plurality of multilayer capacitors;
   a first conductive connection made at the first surface to the second electrode of said multilayer capacitor; and
   a second conductive connection made at the second surface and within the second opening to the first electrode of said multilayer capacitor.

9. The semiconductor device of claim 8, wherein the first opening is a cylindrical opening.

10. The semiconductor device of claim 8, further including an integrated semiconductor component formed on the first surface, said first conductive connection interconnecting the integrated semiconductor component to the multilayer capacitors.

* * * * *